(12) United States Patent
Kamiya

(10) Patent No.: US 6,674,315 B2
(45) Date of Patent: Jan. 6, 2004

(54) CLOCK SIGNAL GENERATION DEVICE

(75) Inventor: Hiroshi Kamiya, Osaka (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/223,299

(22) Filed: Aug. 20, 2002

(65) Prior Publication Data

US 2003/0034819 A1 Feb. 20, 2003

(30) Foreign Application Priority Data

Aug. 20, 2001 (JP) ........................................ 2001-248528

(51) Int. Cl.[7] .............................. G06F 1/04; H03K 3/00
(52) U.S. Cl. ..................................................... 327/293
(58) Field of Search ........................ 327/170, 291–293, 327/295, 296, 141, 142, 146, 147, 149, 154–156, 161

(56) References Cited

U.S. PATENT DOCUMENTS

| 5,530,726 A | * | 6/1996 | Ohno | ........................ | 375/357 |
| 6,255,882 B1 | * | 7/2001 | Hirai | ........................ | 327/291 |
| 6,255,883 B1 | * | 7/2001 | Delvaux et al. | ............ | 327/291 |

FOREIGN PATENT DOCUMENTS

| JP | 57-13567 A | 1/1982 |
| JP | 62-92062 A | 4/1987 |
| JP | 62-200944 A | 9/1987 |
| JP | 2-50715 A | 2/1990 |
| JP | 7-38431 A | 2/1995 |
| JP | 7-501642 A | 2/1995 |
| JP | 2002-73229 A | 3/2002 |

* cited by examiner

Primary Examiner—My-Trang Nu Ton
(74) Attorney, Agent, or Firm—Sughrue Mion, PLLC

(57) ABSTRACT

Each of a plurality of clock generation units has a clock driver which generates a clock signal in accordance with a reference clock, and a supplying unit which supplies the reference clock to the clock driver. The supplying unit supplies the clock driver, in a case where another clock generation unit is already attached to a clock signal generation device at a time the clock generation unit to which the supplying unit belongs is attached to the clock signal generation device, with a clock signal generated by the clock driver of the another clock generation unit as the reference clock during a predetermined time. The clock driver makes a clock signal to be generated follow the supplied reference clock.

10 Claims, 16 Drawing Sheets

| | | WIRING BOARD 200 IS CONNECTED | DELAY TIME DT1 PASSES | |
|---|---|---|---|---|
| ELECTRIC POTENTIAL OF OE TERMINAL 3A[1] | HIGH / LOW | DISABLE | DISABLE | DISABLE |
| BUFFER CIRCUIT 3[1] | | | | |
| ELECTRIC POTENTIAL OF CONTROL TERMINAL 2A[1] | HIGH / LOW | SELF-DRIVEN | SELF-DRIVEN | SELF-DRIVEN |
| CLOCK DRIVER 1[1] | | | | |
| ELECTRIC POTENTIAL OF OE TERMINAL 3A[2] | HIGH / LOW | | ENABLE | DISABLE |
| BUFFER CIRCUIT 3[2] | | | | |
| ELECTRIC POTENTIAL OF CONTROL TERMINAL 2A[2] | HIGH / LOW | | GENERATE CLOCK SIGNAL IN ACCORDANCE WITH SIGNAL FROM DRIVER 1[1] | SELF-DRIVEN |
| CLOCK DRIVER 1[2] | | | | |

FIG. 2B

| ELECTRIC POTENTIAL OF OE TERMINAL 3A[1] | HIGH | | |
| --- | --- | --- | --- |
| | LOW | | |
| BUFFER CIRCUIT 3[1] | DISABLE | DISABLE | DISABLE |
| ELECTRIC POTENTIAL OF CONTROL TERMINAL 2A[1] | HIGH | | |
| | LOW | | |
| CLOCK DRIVER 1[1] | SELF-DRIVEN | SELF-DRIVEN | SELF-DRIVEN |
| SWITH 5[2] | ON | OFF | ON |
| ELECTRIC POTENTIAL OF OE TERMINAL 3A[2] | HIGH | | |
| | LOW | | |
| BUFFER CIRCUIT 3[2] | DISABLE | ENABLE | DISABLE |
| ELECTRIC POTENTIAL OF CONTROL TERMINAL 2A[2] | HIGH | | |
| | LOW | | |
| CLOCK DRIVER 1[2] | SELF-DRIVEN | GENERATE CLOCK SIGNAL IN ACCORDANCE WITH SIGNAL FROM DRIVER 1[1] | SELF-DRIVEN |

| | WIRING BOARD 200 IS CONNECTED | DELAY TIME DT3 PASSES | |
|---|---|---|---|
| ELECTRIC POTENTIAL OF OE TERMINAL 14A[1] HIGH/LOW | | | |
| BUFFER CIRCUIT 14[1] | DISABLE | DISABLE | DISABLE |
| ELECTRIC POTENTIAL OF OE TERMINAL 15A[1] HIGH/LOW | | | |
| BUFFER CIRCUIT 15[1] | DISABLE | DISABLE | DISABLE |
| ELECTRIC POTENTIAL OF CONTROL TERMINAL 12A[1] HIGH/LOW | | | |
| ELECTRIC POTENTIAL OF CONTROL TERMINAL 13A[1] HIGH/LOW | | | |
| CLOCK DRIVER 11[1] | SELF-DRIVEN | SELF-DRIVEN | SELF-DRIVEN |
| ELECTRIC POTENTIAL OF OE TERMINAL 14A[2] HIGH/LOW | | | |
| BUFFER CIRCUIT 14[2] | | ENABLE | DISABLE |
| ELECTRIC POTENTIAL OF OE TERMINAL 15A[2] HIGH/LOW | | | |
| BUFFER CIRCUIT 15[2] | | ENABLE | DISABLE |
| ELECTRIC POTENTIAL OF CONTROL TERMINAL 12A[2] HIGH/LOW | | | |
| ELECTRIC POTENTIAL OF CONTROL TERMINAL 13A[2] HIGH/LOW | | | |
| CLOCK DRIVER 11[2] | | GENERATE CLOCK SIGNAL IN ACCORDANCE WITH SIGNAL FROM DRIVER 11[1] | SELF-DRIVEN |

FIG. 8B

| | | WIRING BOARD 300 IS CONNECTED | DELAY TIME DT3 PASSES | |
|---|---|---|---|---|
| ELECTRIC POTENTIAL OF OE TERMINAL 14A[1] | HIGH LOW | | | |
| BUFFER CIRCUIT 14[1] | | DISABLE | DISABLE | DISABLE |
| ELECTRIC POTENTIAL OF OE TERMINAL 15A[1] | HIGH LOW | | | |
| BUFFER CIRCUIT 15[1] | | DISABLE | DISABLE | DISABLE |
| ELECTRIC POTENTIAL OF CONTROL TERMINAL 12A[1] | HIGH LOW | | | |
| ELECTRIC POTENTIAL OF CONTROL TERMINAL 13A[1] | HIGH LOW | | | |
| CLOCK DRIVER 11[1] | | SELF-DRIVEN | SELF-DRIVEN | SELF-DRIVEN |
| ELECTRIC POTENTIAL OF OE TERMINAL 14A[3] | HIGH LOW | | | |
| BUFFER CIRCUIT 14[3] | | | ENABLE | DISABLE |
| ELECTRIC POTENTIAL OF OE TERMINAL 15A[3] | HIGH LOW | | | |
| BUFFER CIRCUIT 15[3] | | | ENABLE | DISABLE |
| ELECTRIC POTENTIAL OF CONTROL TERMINAL 12A[3] | HIGH LOW | | | |
| ELECTRIC POTENTIAL OF CONTROL TERMINAL 13A[3] | HIGH LOW | | | |
| CLOCK DRIVER 11[3] | | | GENERATE CLOCK SIGNAL IN ACCORDANCE WITH SIGNAL FROM DRIVER 11[1] | SELF-DRIVEN |

FIG. 8C

| | WIRING BOARD 300 IS CONNECTED | DELAY TIME DT3 PASSES | |
|---|---|---|---|
| CLOCK DRIVER 11[1] | SELF-DRIVEN | SELF-DRIVEN | SELF-DRIVEN |
| CLOCK DRIVER 11[2] | SELF-DRIVEN | SELF-DRIVEN | SELF-DRIVEN |
| ELECTRIC POTENTIAL OF OE TERMINAL 14A[3] (HIGH/LOW) | | | |
| BUFFER CIRCUIT 14[3] | | ENABLE | DISABLE |
| ELECTRIC POTENTIAL OF OE TERMINAL 15A[3] (HIGH/LOW) | | | |
| BUFFER CIRCUIT 15[3] | | ENABLE | DISABLE |
| ELECTRIC POTENTIAL OF CONTROL TERMINAL 12A[3] (HIGH/LOW) | | | |
| ELECTRIC POTENTIAL OF CONTROL TERMINAL 13A[3] (HIGH/LOW) | | | |
| CLOCK DRIVER 11[3] | | GENERATE CLOCK SIGNAL IN ACCORDANCE WITH SIGNAL FROM DRIVER 11[1] | SELF-DRIVEN |

FIG. 8D

CLOCK SIGNAL GENERATION DEVICE

BACKGROUND OF THE INVENTION

1. Field of the Invention

The present invention relates to a device for generating a clock signal.

2. Description of the Related Art

A plurality of circuits included in a server apparatus, such as an FT (Fault Tolerant) server, operate in accordance with clock signals. Due to this, the plurality of circuits operate synchronously with each other.

There is known a method of using a plurality of clock drivers, as a method of supplying clock signals to a plurality of circuits.

In this case, in order to synchronize the timings of the clock signals supplied from the plurality of clock drivers with each other, reset signals are applied to the plurality of clock drivers at the timing of starting the system, and at predetermined timings.

The plurality of clock drivers are reset at a same time by the reset signals. Thus, the timings of the clock signals supplied from the plurality of clock drivers are adjusted.

However, according to the above method, there is a problem that each time the plurality of clock drivers are reset, the system becomes unable to operate, and the system stops.

SUMMARY OF THE INVENTION

Accordingly, it is an object of the present invention to provide a clock signal generation device which adjusts the timings of clock signals without stopping the system.

To achieve the above object, a clock signal generation device according to the present invention is a device to and from which a plurality of clock generation units for generating clock signals can be attached and detached, and which comprises at least one clock generation unit, wherein:
  each of the plurality of clock generation units comprises
    a clock driver which generates a clock signal in accordance with a reference clock, and
    a supplying unit which supplies the reference clock to the clock driver;
  the supplying unit supplies the clock driver, in a case where another clock generation unit is already attached to the clock signal generation device at a time the clock generation unit to which the supplying unit belongs is attached to the clock signal generation device, with a clock signal generated by the clock driver of the another clock generation unit as the reference clock during a predetermined first time; and
  the clock driver makes a clock signal to be generated follow the supplied reference clock.

According to this invention, it is possible to adjust the timings of clock signals without stopping the system.

The supplying unit may supply the clock driver of the clock generation unit to which the supplying unit belongs, with a clock signal generated by the clock driver of the clock generation unit to which the supplying unit belongs as the reference clock, after the first time passes.

The supplying unit may comprise:
  a control unit which outputs a control signal for selecting the reference clock from clock signals generated by the clock drivers of the clock generation units which are attached to the clock signal generation device; and
  a selector circuit which selects one of clock signals generated by the clock drivers of the clock generation units which are attached to the clock signal generation device in accordance with the control signal, and supplies the selected clock signal to the clock driver as the reference clock.

The control unit may comprise:
  a delay circuit which counts the first time; and
  a control circuit which outputs the control signal to the selector circuit in accordance with a counting result of the delay circuit.

The delay circuit may supply a first level signal to the control circuit during the first time, and supply a second level signal to the control circuit after the first time passes.

The control circuit may output to the selector circuit, a control signal for controlling the selector circuit to select a clock signal generated by the clock driver of another clock generation unit, in a case where the control circuit is supplied with the first level signal and the another clock generation unit is attached to the clock signal generation device.

The control circuit may output to the selector circuit, a control signal for controlling the selector circuit to select a clock signal generated by the clock driver of the clock generation unit to which the control circuit belongs, in a case where the control circuit is supplied with the first level signal and no other clock generation unit is attached to the clock signal generation device.

The control circuit may output to the selector circuit, a control signal for controlling the selector circuit to select a clock signal generated by the clock driver of the clock generation unit to which the control circuit belongs, in a case where the control circuit is supplied with the second level signal.

The control unit may further comprise an adjusting unit which shuts off the second level signal supplied by the delay circuit, and instead supplies the first level signal to the control circuit during a predetermined second time. The adjusting unit may supply the first level signal to the control circuit during the second time, each time a predetermined third time passes.

The clock driver may comprise a PLL (Phase Locked Loop) circuit which makes the clock signal follow the reference clock.

BRIEF DESCRIPTION OF THE DRAWINGS

These objects and other objects and advantages of the present invention will become more apparent upon reading of the following detailed description and the accompanying drawings in which:

FIG. 2B is a timing chart showing actions of the wiring board 100 and a wiring board 200 constituting the clock supplying unit shown in FIG. 1;

FIG. 4B is a timing chart showing actions of the wiring board 100 and a wiring board 200 constituting the clock supplying unit shown in FIG. 3;

FIG. 6 is a timing chart showing actions of wiring boards 100 and 200 constituting the clock supplying unit shown in FIG. 5;

FIG. 8B is a timing chart showing actions of the wiring board 100 and a wiring board 200 constituting the clock supplying unit shown in FIGS. 7A and 7B, FIG. 5C is a timing chart showing actions of the wiring board 100 and a wiring board 300 constituting the clock supplying unit shown in FIGS. 7A and 7B, and FIG. 8D is a timing chart showing actions of the wiring boards 100, 200, and 300 constituting the clock supplying unit shown in FIGS. 7A and 7B.

DETAILED DESCRIPTION OF THE PREFERRED EMBODIMENTS

First Embodiment

A clock supplying unit according to a first embodiment of the present invention will now be explained with reference to the drawings.

The clock supplying unit according to the first embodiment is built in an electronic apparatus, to supply a clock signal to each circuit constituting the electronic apparatus.

Figure 1:
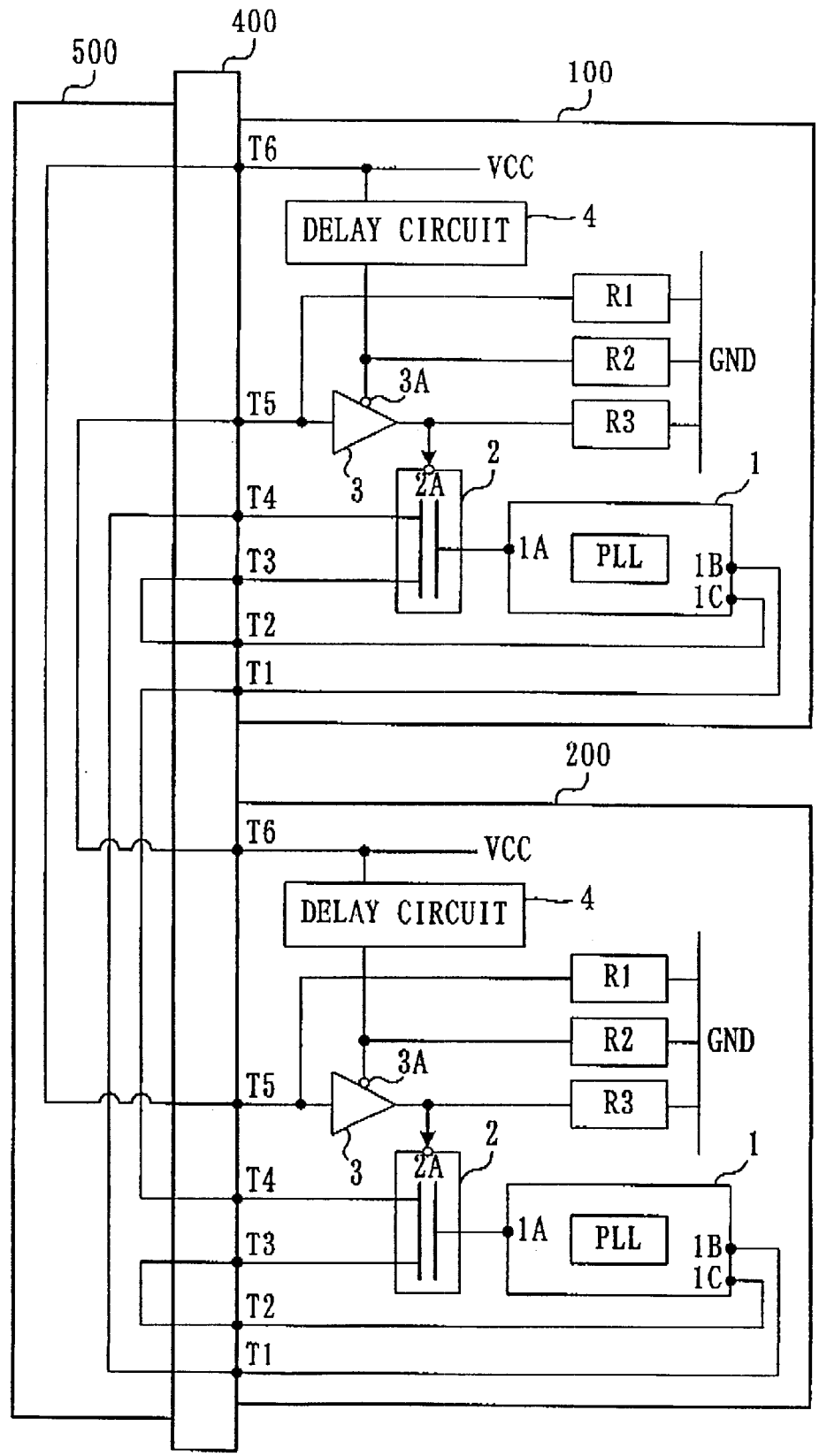
FIG. 1 is a diagram showing a structure of a clock supplying unit according to a first embodiment.

As shown in FIG. 1, the clock supplying unit comprises wiring boards 100 and 200, a connector 400, and a back board 500.

The wiring boards 100 and 200 are attached to the connector 400 which is mounted on the back board 500. In other words, the wiring boards 100 and 200 are connected to the back board 500 via the connector 400.

Each of the wiring boards 100 and 200 comprises a clock driver 1, a selector 2, a buffer circuit 3, a delay circuit 4, and resistor circuits R1, R2, and R3, as shown in FIG. 1. Further, each of the wiring boards 100 and 200 comprises connection terminals T1 to T6. The connection terminals T1 to T6 comprised in the wiring boards 100 and 200 are connected to one another via wirings formed on the back board 500. Specifically, as shown in FIG. 1, the connection terminal T1 of either one of the wiring boards is connected to the connection terminal T4 of the other one of the wiring boards, the connection terminal T2 is connected to the connection terminal T3 of the same wiring board, and the connection terminal T5 of either one of the wiring boards is connected to the connection terminal T6 of the other one of the wiring boards.

The clock driver 1 includes an input terminal 1A, and two output terminals 1B and 1C. The clock driver 1 generates a clock signal which is synchronous with a clock signal supplied thereto through the input terminal 1A. Specifically, the clock driver 1 comprises a PLL (Phase Locked Loop) circuit, and causes the frequency and phase of a clock signal to be generated to follow the frequency and phase of the supplied clock signal.

The generated clock signal is supplied from the output terminal 1B to the selector 2 of the other wiring board through the connection terminal T1 and the connection terminal T4 of the other wiring board. Also, the generated clock signal is supplied from the output terminal 1C to the selector 2 of the same wiring board through the connection terminal T2 and the connection terminal T3 of the same wiring board.

Further, the generated clock signal is supplied to other circuits (not illustrated) built in the electronic apparatus through the output terminals 1B and 1C.

The selector 2 comprises a control terminal 2A, and supplies one of the clock signals supplied thereto through the connection terminals T3 and T4 to the clock driver 1 in accordance with electric potential of the control terminal 2A. For example, in a case where the electric potential of the control terminal 2A is at a low level, the selector 2 supplies the clock signal supplied thereto through the connection terminal T3 to the clock driver 1. In a case where the electric potential of the control terminal 2A is at a high level, the selector 2 supplies the clock signal supplied thereto through the connection terminal T4 to the clock driver 1.

The buffer circuit 3 comprises an output enable (OE) terminal 3A, and changes its state in accordance with electric potential of the OE terminal 3A. Specifically, in a case where the electric potential of the OE terminal 3A is at a high level, the buffer circuit 3 becomes a disable state. In a case where the electric potential of the OE terminal 3A is at a low level, the buffer circuit 3 becomes an enable state.

In the enable state, the buffer circuit 3 outputs a control signal having a level corresponding to the electric potential of the connection terminal T5 to the control terminal 2A of the selector 2. For example, in a case where the electric potential of the connection terminal T5 is at a high level, the buffer circuit 3 outputs a control signal having a high level. In a case where the electric potential of the connection terminal T5 is at a low level, the buffer circuit 3 outputs a control signal having a low level.

The OE terminal 3A of the buffer circuit 3 is connected to a power source VCC via the delay circuit 4, and grounded via the resistor R2. And an input terminal of the buffer circuit 3 is connected to the connection terminal T5 and grounded via the resistor R1. Further, an output terminal of the buffer circuit 3 is connected to the control terminal 2A of the selector 2 and grounded via the resistor R3.

The delay circuit 4 controls the state of the buffer circuit 3 by controlling the supply of signals from the power source VCC to the buffer circuit 3. Specifically, the delay circuit 4 does not supply a high level signal supplied by the power source VCC to the OE terminal 3A of the buffer circuit 3 during a preset delay time DT1 after the wiring board is connected to the back board 500. In other words, the delay circuit 4 supplies a low level signal to the OE terminal 3A of the buffer circuit 3 during the delay time DT1. Due to this, during the delay time DT1 after the wiring board is connected to the back board 500, the buffer circuit 3 is kept in the enable state. Then, when the delay time DT1 passes, the delay circuit 4 supplies a high level signal supplied from the power source VCC to the OE terminal 3A of the buffer circuit 3. In response to this, after the delay time DT1 passes, the buffer circuit 3 becomes the disable state.

Next, the operation of the clock supplying unit according to the first embodiment will be explained.

In the following explanation, in order to distinguish the wiring board 100 and the wiring board 200, a numeral [1] indicating the wiring board 100 or a numeral [2] indicating the wiring board 200 will be affixed to the reference numerals.

It is assumed that a time τ1 taken by a clock signal to reach the input terminal 1A[2] from the output terminal 1B[1], a time τ2 taken by a clock signal to reach the input terminal 1A[1] from the output terminal 1C[1], a time τ3 taken by a clock signal to reach the input terminal 1A[1] from the output terminal 1B[2], and time τ4 taken by a clock signal to reach the input terminal 1A[2] from the output terminal 1C[2] are all the same.

output terminal 1B[1]→input terminal 1A[2]:τ1
output terminal 1C[1]→input terminal 1A[1]:τ2
output terminal 1B[2]→input terminal 1A[1]:τ3
output terminal 1C[2]→input terminal 1A[2]:τ4
τ1=τ2=τ3=τ4

(1) First, explanation will be given to a case where the wiring board 100 is to be connected to the back board 500, when either of the wiring board 100 and wiring board 200 is not yet connected to the back board 500.

Figure 2A:
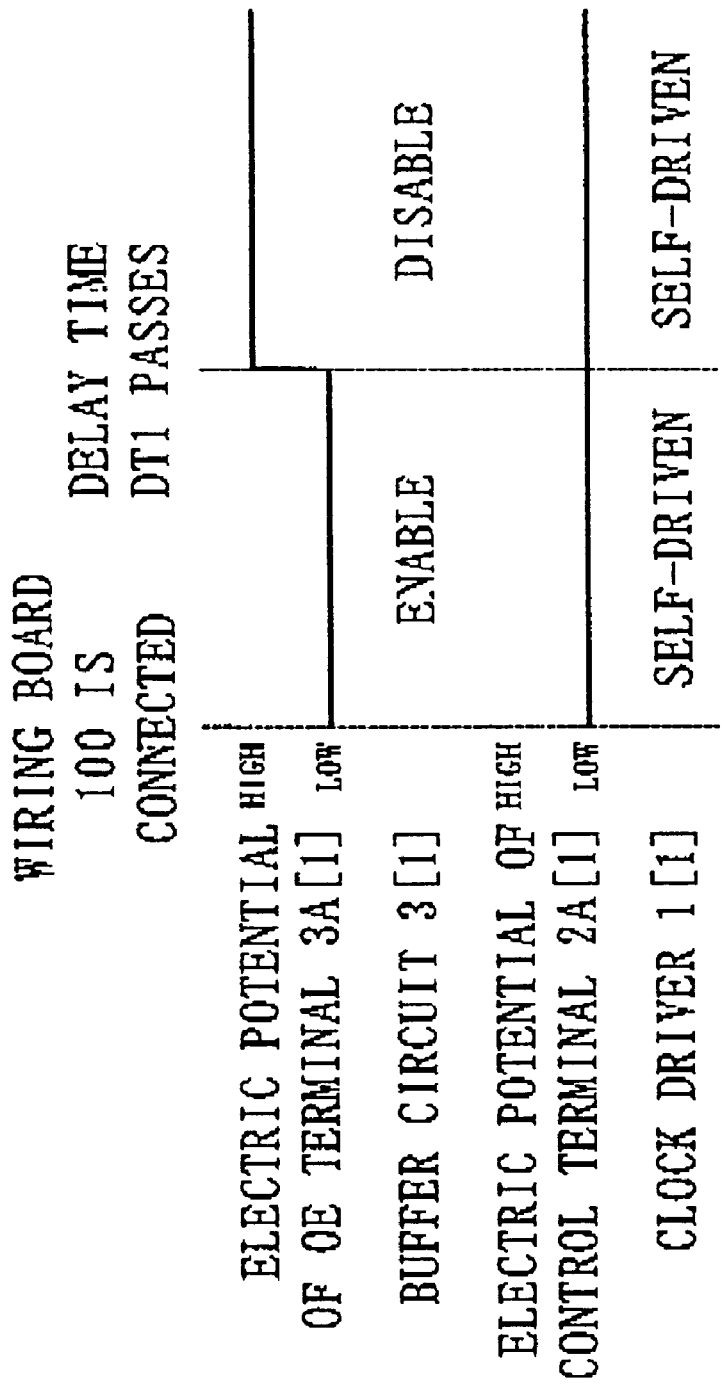
FIG. 2A is a timing chart showing actions of a wiring board 100 which constitutes the clock supplying unit shown in FIG. 1.
Figure 3:
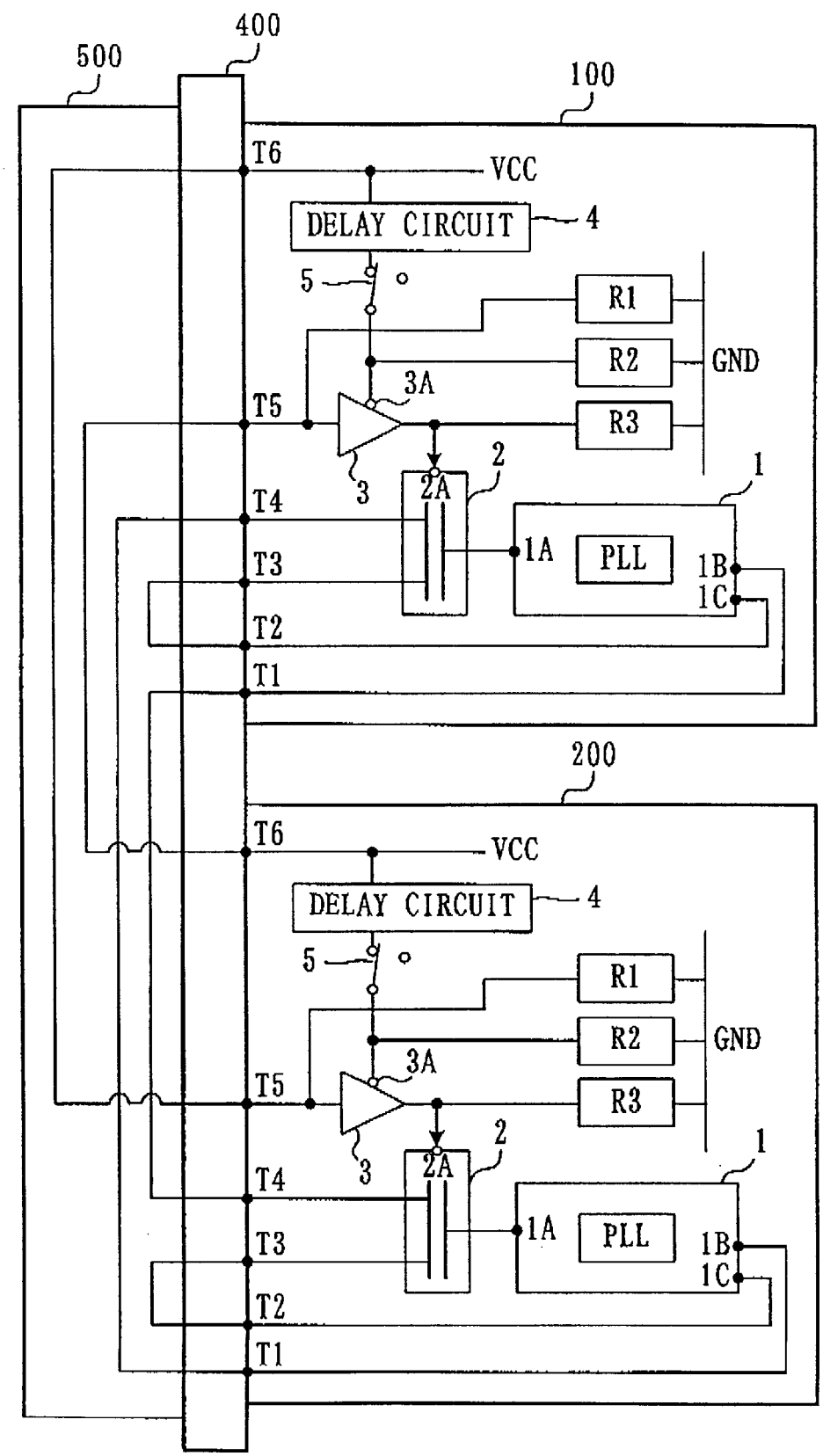
FIG. 3 is a diagram showing a structure of a clock supplying unit according to a second embodiment.

FIG. 2A is a timing chart showing actions of the wiring board 100.

During the delay time DT1 after the wiring board 100 is connected to the back board 500, the delay circuit 4[1] does not supply a signal supplied from the power source VCC to the OE terminal 3A[1]. The OE terminal 3A[1] is grounded via the resistor R2.

Therefore, as shown in FIG. 2A, the electric potential of the OE terminal 3A[1] is kept at a low level, and the buffer circuit 3[1] is kept in the enable state during the delay time DT1.

Since only the wiring board 100 is connected to the back board 500, the electric potential of the connection terminal T5[1] is at a low level. Accordingly, the buffer circuit 3[1] outputs a low level control signal to the control terminal 2A[1]. Thus, the electric potential of the control terminal 2A[1] becomes a low level, as shown in FIG. 2A.

In accordance with the control signal from the buffer circuit 3[1], the selector 2[1] supplies a clock signal supplied thereto through the connection terminal T3[1], i.e., a clock signal generated by the clock driver 1[1] to the clock driver 1[1].

Due to this, the clock driver 1[1] is self-driven to generate a clock signal. Specifically, the clock driver 1[1] generates a clock signal in accordance with the clock signal generated by the clock driver 1[1].

When the delay time DT1 passes, the delay circuit 4[1] supplies a signal supplied thereto from the power source VCC[1] to the OE terminal 3A[1]. In response to this, the electric potential of the OE terminal 3A[1] becomes a high level, and the buffer circuit 3[1] becomes the disable state, as shown in FIG. 2A.

Since the output terminal of the buffer circuit 3[1] is grounded through the resistor R3, the electric potential of the control terminal 2A[1] does not change from a low level, as shown in FIG. 2A. Therefore, even when the delay time DT1 passes, the selector 2[1] keeps supplying the clock signal supplied thereto through the connection terminal T3[1] to the clock driver 1[1]. As a result, even when the delay time DT1 passes, the clock driver 1[1] keeps generating a clock signal white being self-driven, As described above, in a case where the wiring board 100 is only connected to the back board 500, the clock driver 1[1] generates a clock signal while being self-driven.

Also in a case where the wiring board 100 is not connected to the back board 500, but the wiring board 200 is only connected to the back board 500, the same actions take place on the wiring board 200.

(2) Next, explanation will be given to a case where in the state that only the wiring board 100 is connected to the back board 500, the delay time DT1 for the wiring board 100 passes, and thereafter the wiring board 200 is connected to the back board 500.

FIG. 2B is a timing chart showing actions of the wiring board 100 and the wiring board 200.

As described above, after the delay time DT1 for the wiring board 100 passes, the clock driver 1[1] generates a clock signal while being self-driven.

When the wiring board 200 is connected to the back board 500, a high level signal is supplied from the power source VCC[2] to the input terminal of the buffer circuit 3[1].

However, the buffer circuit 3[1] is in the disable state after the delay time DT1 for the wiring board 100 passes. Due to this, the electric potential of the control terminal 2A[1] does not change from a low level.

Accordingly, even when the wiring board 200 is connected to the back board 500, the clock driver 1[1] keeps generating a clock signal while being self-driven.

On the other hand, during the delay time DT1 after the wring board 200 is connected to the back board 500, the delay circuit 4[2] does not supply a signal supplied by the power source VCC[2] to the OE terminal 3A[2]. The OE terminal 3A[2] is grounded through the resistor R2.

Thus, as shown in FIG. 2B, during the delay time DT1, the electric potential of the OE terminal 3A[2] is at a low level, and the buffer circuit 3[2] is in the enable state.

When the wiring board 200 is connected to the back board 500, a high level signal is supplied to the input terminal of the buffer circuit 3[2] from the power source VCC[1]. In accordance with this, the buffer circuit 3[2] outputs a high level control signal to the control terminal 2A[2]. Due to this, the electric potential of the control terminal 2A[2] becomes a high level, as shown in FIG. 2B.

In response to the control signal from the buffer circuit 3[2], the selector 2[2] supplies a clock signal supplied thereto through the connection terminal T4[2], i.e., a clock signal generated by the clock driver 1[1], to the clock driver 1[2].

In response to this, the clock driver 1[2] generates a clock signal in accordance with the clock signal generated by the clock driver 1[1].

At this time, since T1 is equal to T2 as described above, the timing at which the clock signal from the clock driver 1[1] is input to the clock driver 1[1], and the timing at which the clock signal from the clock driver 1[1] is input to the clock driver 1[2] are coincident.

Thus, the clock driver 1[2] can generate a clock signal having a frequency and phase equal to the frequency and phase of the clock signal generated by the clock driver 1[1].

When the delay time DT1 for the wiring board 200 passes, the delay circuit 4[2] supplies a signal supplied by the power source VCC[2] to the OE terminal 3A[2]. Thus, as shown in FIG. 2B, the electric potential of the OE terminal 3A[2] becomes a high level, and the buffer circuit 3[2] becomes the disable state.

Since the output terminal of the buffer circuit 3[2] is grounded through the resistor R3, the electric potential of the control terminal 2A[2] becomes a low level as shown in FIG. 2B. Therefore, when the delay time DT1 passes, the selector 2[2] supplies a clock signal supplied thereto through the connection terminal T3[2], i.e., a clock signal generated by tie clock driver 1[2], to the clock driver 1[2].

As a result, when the delay time DT1 passes, the clock driver 1[2] generates a clock signal by being self-driven.

At this time, since τ1 is equal to τ4 as described above, the frequency and phase of the clock signal supplied to the selector 2[2] through the connection terminal T3[2] are coincident with the frequency and phase of the clock signal supplied to the selector 2[2] through the connection terminal T4[2]. That is, even if the selector 2[2] switches the clock signals to be supplied t) the clock driver 1[2] after the delay time DT1 passes, the frequency and phase of a clock signal input to the clock driver 1[2] does not change.

Therefore, the clock driver 1[2] can generate a clock signal having a frequency and phase equal to the frequency and phase of the clock signal generated by the clock driver 1[1] by using the self-generated clock signal.

By the way described above, the frequency and phase of the clock signal generated by the clock driver 1[1] and the frequency and phase of the clock signal generated by the clock driver 1[2] can be made coincident.

Since there is no need of resetting the clock driver 1[1] and the clock driver 1[2], it is possible to adjust the timings of the clock signals without stopping the operation of the electronic apparatus (system) for merely an instant.

Also in a case where the wiring board 200 is connected to the back board 500 first, and then the wiring board 100 is connected to the back board 500, the same actions as above will be performed.

(3) Next, explanation will be given to a case where the wiring board 100 will be detached from the back board 500 when both of the wiring board 100 and the wiring board 200 are generating clock signals while being self-driven.

In a case where both of the wiring boards 100 and 200 are generating clock signals while being self-driven, the clock driver 1[1] and the clock driver 1[2] are both generating clock signals in accordance with self-generated clock signals.

Accordingly, it is possible to detach the wiring board 100 from the back board 500 without causing any influence on the clock signal generating action of the clock driver 1[2].

The same applies to the case where the wiring board 200 will be detached when both of the wiring boards 100 and 200 are generating clock signals while being self-driven.

Second Embodiment

A clock supplying unit according to a second embodiment of the present invention will be explained below with reference to the drawings.

Likewise the first embodiment, the clock supplying unit according to the second embodiment comprises a wiring board 100, a wiring board 200, a connector 400, and a back board 500, and supplies a clock signal to each circuit constituting an electronic apparatus.

Each of the wiring boards 100 and 200 comprises a switch 5 in addition to the components described in the first embodiment.

One terminal of the switch 5 is connected to the OE terminal 3A of the buffer circuit 3, and the other terminal thereof is connected to the power source VCC through the delay circuit 4. The switch 5 may be switched on/off by a manual operation. Or, the switch 5 may be automatically switched on/off at a preset time. It is preferable that the continuation time of the on state be longer than the delay time DT1 set to the delay circuit 4.

Components other than the above are the same as those of the first embodiment.

The operation of the clock supplying unit according to the second embodiment will be explained.

(1) First, explanation will be given to a case where only the wiring board 100 is connected to the back board 500.

Figure 4A:
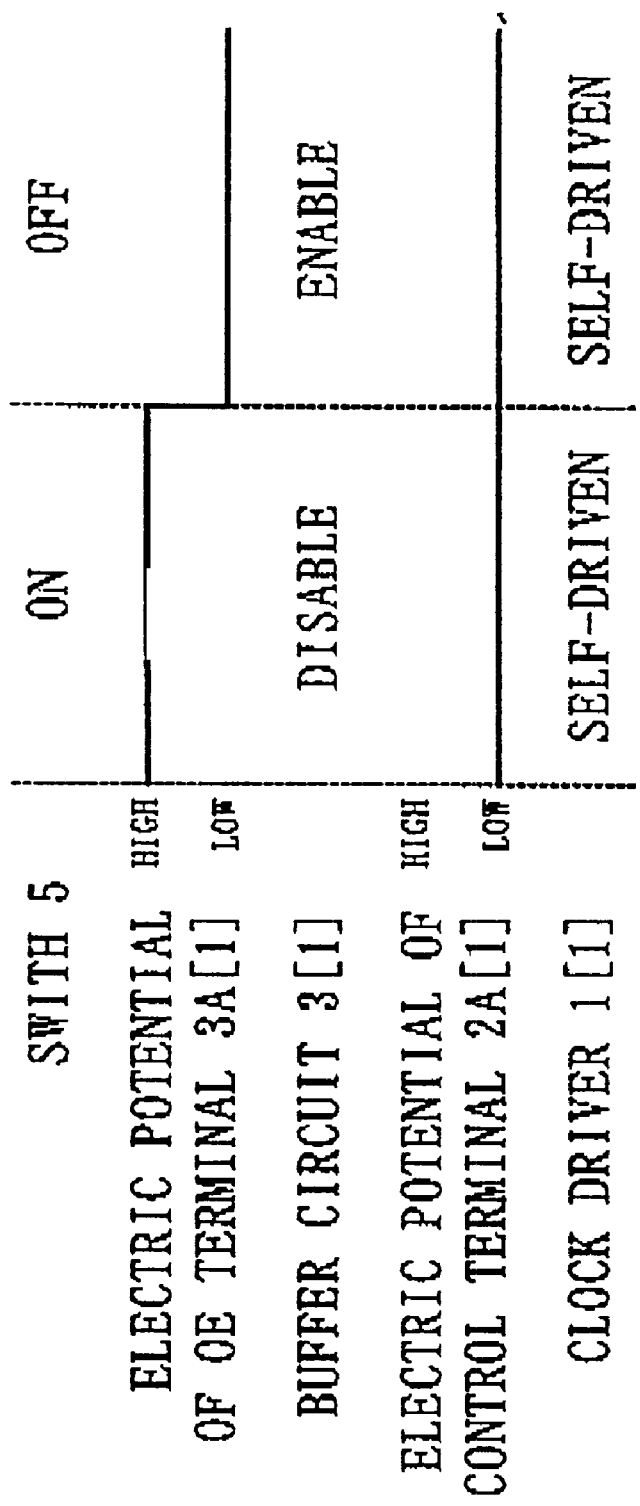
FIG. 4A is a timing chart showing actions of a wiring board 100 constituting the clock supplying unit shown in FIG. 3.

FIG. 4A is a timing chart showing actions of the wiring board 100.

When the switch 5[1] is switched on, the wiring board 100 is in substantially the same state as that described in the first embodiment. Thus, the clock driver 1[1] generates a clock signal while being self-driven, as described in the first embodiment. When the switch 5[1] is switched off, supply of a signal from the VCC[1] to the OE terminal 3A[1] is stopped. Therefore, as shown in FIG. 4A, the electric potential of the OLE terminal 3A[1] becomes a low level, and the buffer circuit 3[1] becomes the enable state.

However, since only the wiring board 100 is connected to the back board 500, the electric potential of the connection terminal T5[1] is at a low level. Therefore, the buffer circuit 3[1] outputs a low level control signal to the control terminal 2A[1]. Accordingly, the electric potential of the control terminal 2A[1] does not change from a low level as shown in FIG. 2A.

In accordance with the control signal from the buffer circuit 3[1], the selector 2[1] supplies a clock signal supplied thereto through the connection terminal T3[1], i.e., a clock signal generated by the clock driver 1[1], to the clock driver 1[1]. Due to this, the clock driver 1[1] generates a clock signal while being self-driven.

In a case where only the wiring board 100 is connected to the back board 500 as described above, the clock driver 1[1] keeps generating a clock signal while being self-driven, regardless of whether the switch 5[1] is switched on or off.

In a case where the wiring board 100 is not connected to the back board 500 but only the wiring board 200 is connected to the back board 500, the same actions as described above will be performed on the wiring board 200.

(2) Next, explanation will be given to a case where the switch 5[2] will be temporarily switched off when both of the wiring board 100 and the wiring board 200 are generating clock signals while being self-driven.

FIG. 4B is a timing chart showing actions on the wiring boards 100 and 200.

In a case where the switch 5[1] and the switch 5[2] are switched on, each of the clock driver 1[1] and the clock driver 1[2] is generating a clock signal in accordance with a self-generated clock signal, likewise the first embodiment.

When the switch 5[2] is switched off while being in the above state, supply of a signal from the power source VCC[2] to the OE terminal 3A[2] is stopped. In response to this, the electric potential of the OE terminal 3A[2] becomes a low level, and the buffer circuit 3[2] becomes the enable state, as shown in FIG. 4B.

In this case, since both of the wiring board 100 and the wiring board 200 are connected to the back board 500, the electric potential of the connection terminal T5[2] is at a high level. Accordingly, the buffer circuit 3[2] outputs a high level control signal to the control terminal 2A[2]. Due to this, the electric potential of the control terminal 2A[2] changes from a low level to a high level, as shown in FIG. 4B.

In accordance with the control signal from the buffer circuit 3[2], the selector 2[2] supplies a clock signal supplied thereto through the connection terminal T4[2], i.e., a clock signal generated by the clock driver 1[1], to the clock driver 1[2]. In response to this, the clock driver 1[2] generates a clock signal in accordance with the clock signal generated by the clock driver 1[1].

After this, when the switch 5[2] is switched on, a high level signal is supplied from the power source VCC[2] to the OE terminal 3A[2] again. Thus, the electric potential of the OE terminal 3A[2] becomes a high level, and the buffer circuit 3[2] becomes the disable state, as shown in FIG. 4B.

Due to this, the electric potential of the control terminal 2A[2] changes from a high level to a low level as shown in FIG. 4B. Then, the selector 2[2] supplies a clock signal supplied thereto through the connection terminal T3[2], i.e., a clock signal generated by the clock driver 1[2] to the clock driver 1[2]. Thus, the clock driver 1[2] returns to the self-driven state.

As described above, while the switch 5[2] is switched off, the clock driver 1[2] generates a clock signal in accordance with a clock signal supplied from the clock driver 1[1]. Therefore, it is preferable that the off time of the switch 5[1] be long enough to make the clock signals respectively generated by the clock driver 1[1] and the clock driver 1[2] have the same frequency and phase as each other.

If so, by switching off the switch S[2], it is possible to make the frequency and phase of the clock signal generated by the clock driver 1[1] coincide with the frequency and phase of the clock signal generated by the clock driver 1[2].

Further, since there is no need of resetting the clock driver 1[1] and the clock driver 1[2], it is possible to adjust the timings of clock signals without stopping the operation of the electronic apparatus (system) for even an instant.

Also in a case where the switch 5[1] is temporarily switched off when the wiring boards 100 and 200 are both generating clock signals while being self-driven, the same actions as described above will be performed.

Further, only one of the wiring boards 100 and 200 may comprise the switch 5. Also in this case, it is possible to make the frequency and phase of the clock signal generated by the clock driver 1[1] coincide with the frequency and phase of the clock signal generated by the clock driver 1[2] by temporarily switching off the switch 5.

Third Embodiment

Next, a clock supplying unit according to a third embodiment of the present invention will be explained with reference to the drawings.

Likewise the first embodiment, the clock supplying unit according to the third embodiment comprises a wiring board 100, a wiring board 200, a connector 400, and a back board 500, and supplies a clock signal to each circuit constituting an electronic apparatus.

Figure 5:
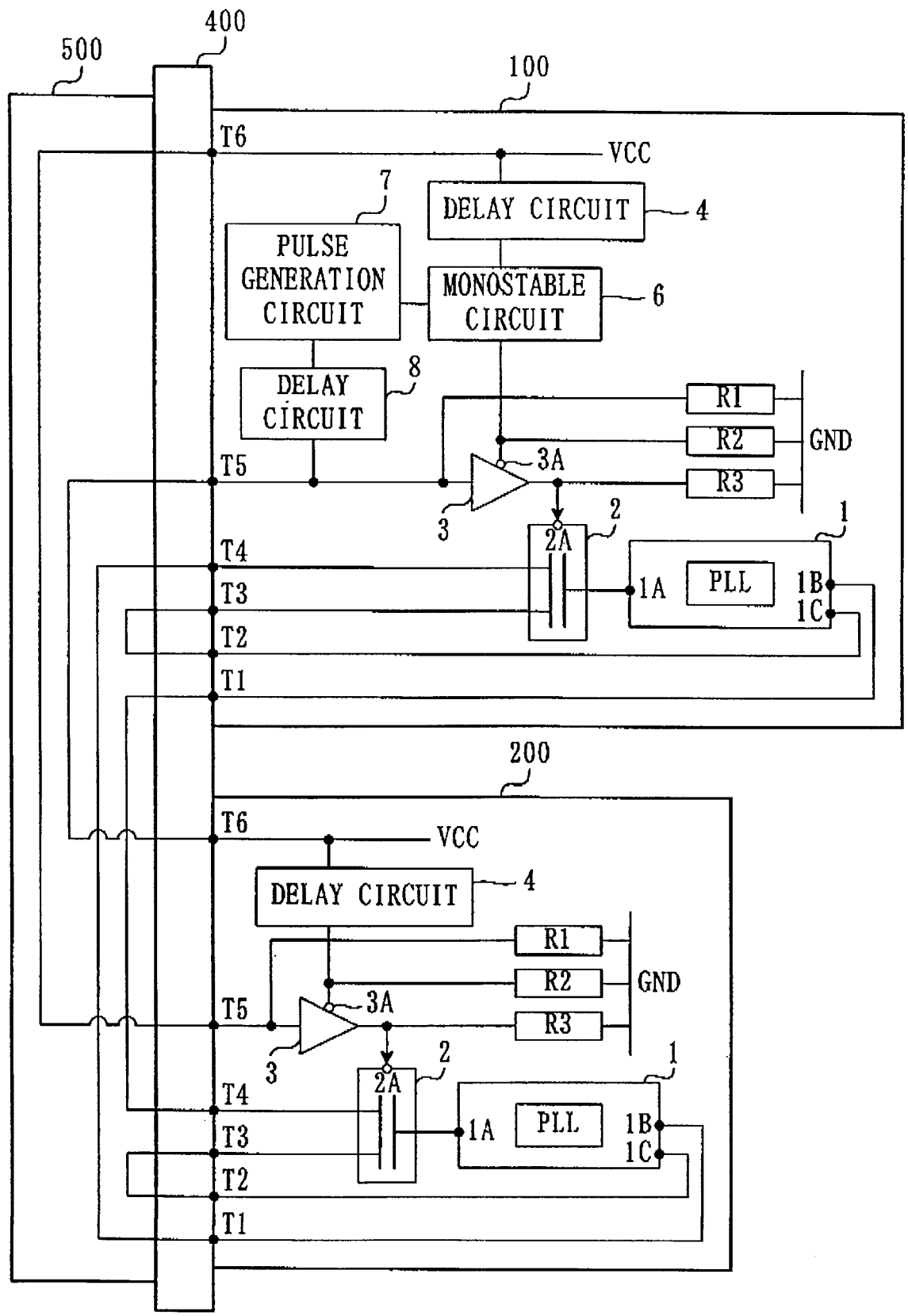
FIG. 5 is a diagram showing a structure of a clock supplying unit according to a third embodiment.

As shown in FIG. 5, the wiring board 100 comprises a monostable circuit 6, a pulse generation circuit 7, and a delay circuit 8 in addition to the components shown in the first embodiment.

The monostable circuit 6 is connected between the OE terminal 3A of the buffer circuit 3 and the delay circuit 4. The monostable circuit 6 supplies a high level signal supplied thereto from the power source VCC through the delay circuit 4, to the OE terminal 3A of the buffer circuit 3. Further, the monostable circuit 6 outputs a low level signal to the OP terminal 3A during a predetermined time BT, in response to a pulse supplied from the pulse generation circuit 7.

The pulse generation circuit 7 generates a pulse in response to a start signal instructing about a start of operation which is supplied from the delay circuit 8, and outputs the generated pulse to the monostable circuit 6. After this, the pulse generation circuit 7 generates a pulse at every preset time, and outputs the generated pulse to the monostable circuit 6.

The delay circuit 8 outputs a start signal instructing a start of operation to the pulse generation circuit 7 when a predetermined delay time DT2 passes after the electric potential of the connection terminal T5 changes from a low level to a high level. The delay time DT2 is longer than a delay time DT1 set to the delay circuit 4.

Components other than the above are substantially the same as those of the first embodiment.

The operation of the clock supplying unit according to the third embodiment will now be explained.

(1) First, explanation will be given to a case where when either of the wiring board 100 aid wiring board 200 is not connected to the back board 500, only the wiring board 100 will be connected to the back board 500.

In a case where only the wiring board 100 is connected to the back board 500, the electric potential of the connection terminal T5[1] is at a low level. Accordingly, the pulse generation circuit 7 and the delay circuit 8 do not operate, and thus the level of a signal to be supplied to the OE terminal 3A[1] is not to be changed to a low level by the monostable circuit 6.

Accordingly, in a case where only the wiring board 100 is connected to the back board 500, the clock driver 1[1] generates a clock signal while being self-driven, likewise the first embodiment.

(2) Next, explanation will be given to a case where when the wiring board 100 is already connected to back board 500, the wiring board 200 will be connected to a back board 500 after the delay time DT1 for the wiring board 100 passes.

Figure 6:
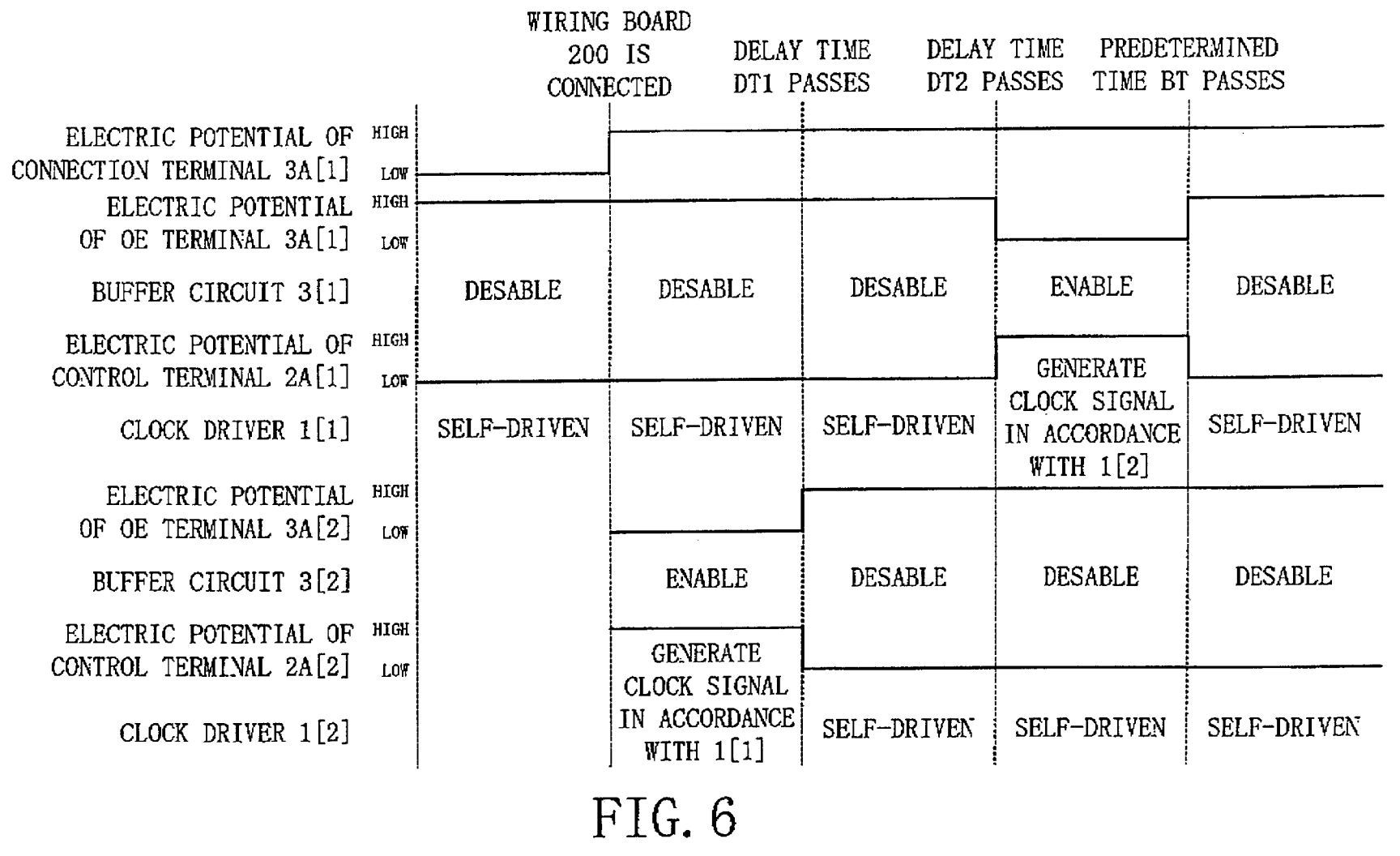

FIG. 6 is a timing chart showing actions on the wiring hoard 100 and the wiring board 200.

After the delay time DT1 for the wiring board 100 passes, the clock driver 1[1] is generating a clock signal while being self-driven, as described above.

When the wiring board 200 is connected to the back board 500, the electric potential of the connection terminal T5[1] changes from a low level to a high level, as shown in FIG. 6.

In response to the change of the electric potential of the connection terminal T5[1] from a low level to a high level, the delay circuit 8 starts operating.

On the other hand, the clock driver 1[2] generates a clock signal in accordance with a clock signal from the clock driver 1[1] during the delay time DT1 after the wring board 200 is connected to the back board 500, likewise the first embodiment Then, when the delay time DT1 passes, the clock driver 1[2] generates a clock signal while being self-driven.

When the delay time DTI passes after the wiring board 200 is connected to the back board 500, the delay circuit 8 outputs a start signal to the pulse generation circuit 7.

The pulse generation circuit 7 generates a pulse in response to the start signal supplied from the delay circuit 8, and outputs the generated pulse to the, monostable circuit 6.

In response to the pulse supplied from the pulse generation circuit 7, the monostable circuit 6 supplies a low level signal to the OE terminal 3A[1] during the predetermined time BT. Due to this, the electric potential of the OE terminal 3A[1] becomes a low level, and the buffer circuit 3[1] becomes the enable state, as shown in FIG. 6.

Since the electric potential of the connection terminal T5[1] is at a high level as described above, the buffer circuit 3[1] outputs a high level control signal to the control terminal 2A[1]. Due to this, the electric potential of the control terminal 2A[1] becomes a high level, as shown in FIG. 6.

In response to the control signal from the buffer circuit 3[1], the selector 2[1] supplies a clock signal supplied thereto through the connection terminal T4[1], i.e. a clock signal generated by the clock driver 1[2], to the clock driver

1[1]. Thus, the clock driver 1[1] generates a clock signal in accordance with the clock signal generated by the clock driver 1[2].

Then, when the predetermined time BT passes, the monostable circuit 6 supplies a high level signal supplied from the power source VCC[1] to the OE terminal 3A[1] again.

In response to this, the electric potential of the OE terminal 3A[1] returns to a high level, and the buffer circuit 3[1] returns to the disable state, as shown in FIG. 6. As a result, the clock driver 1[1] generates a clock signal while being self-driven again.

As described above, while the monostable circuit 6 outputs a low level signal, the clock driver 1[1] generates a clock signal in accordance with a clock signal from the clock driver 1[2]. Therefore, it is preferable that the predetermined time BT has a sufficient length to make the frequency and phase of the clock signal generated by the clock driver 1[1] and the frequency and phase of the clock signal generated by the clock driver 1[2] coincide with each other.

If the predetermined time BT has a sufficient length, it is possible to make the frequency and phase of the clock signal generated by the clock driver 1[1] and the frequency and phase of the clock signal generated by the clock driver 1[2] coincide with each other during the predetermined time BT.

Since the pulse generation circuit 7 outputs a pulse at every preset time, it is possible to regularly adjust the difference between the clock signals generated by the clock driver 1[1] and the clock driver 1[2] respectively. As a result, a highly reliable clock supplying unit can be realized.

Further, since there is no need of resetting the clock driver 1[1] and clock driver 1[2], it is possible to adjust the timings of clock signals without stopping the operation of the electronic apparatus (system) for even an instant.

The order of connecting the wiring board 100 and the wiring board 200 to the back board 500 may be reversed from the above described order. Specifically, the wiring board 200 may be connected to the back board 500 first, and after the delay time DT1 for the wiring board 200 passes, the wiring board 100 may be connected to the back board 500. Also in this case, the same actions as described above will be performed.

Both of the wiring board 100 and the wiring board 200 may comprise the monostable circuit 6, the pulse generation circuit 7, and the delay circuit 8.

Fourth Embodiment

Next, a clock supplying unit according to a fourth embodiment of the present invention will be explained with reference to the drawings.

The clock supplying unit according to the fourth embodiment is built in an electronic apparatus and supplies a clock signal to each circuit constituting the electronic apparatus likewise the clock supplying units shown in the first to third embodiments.

Figure 7A:
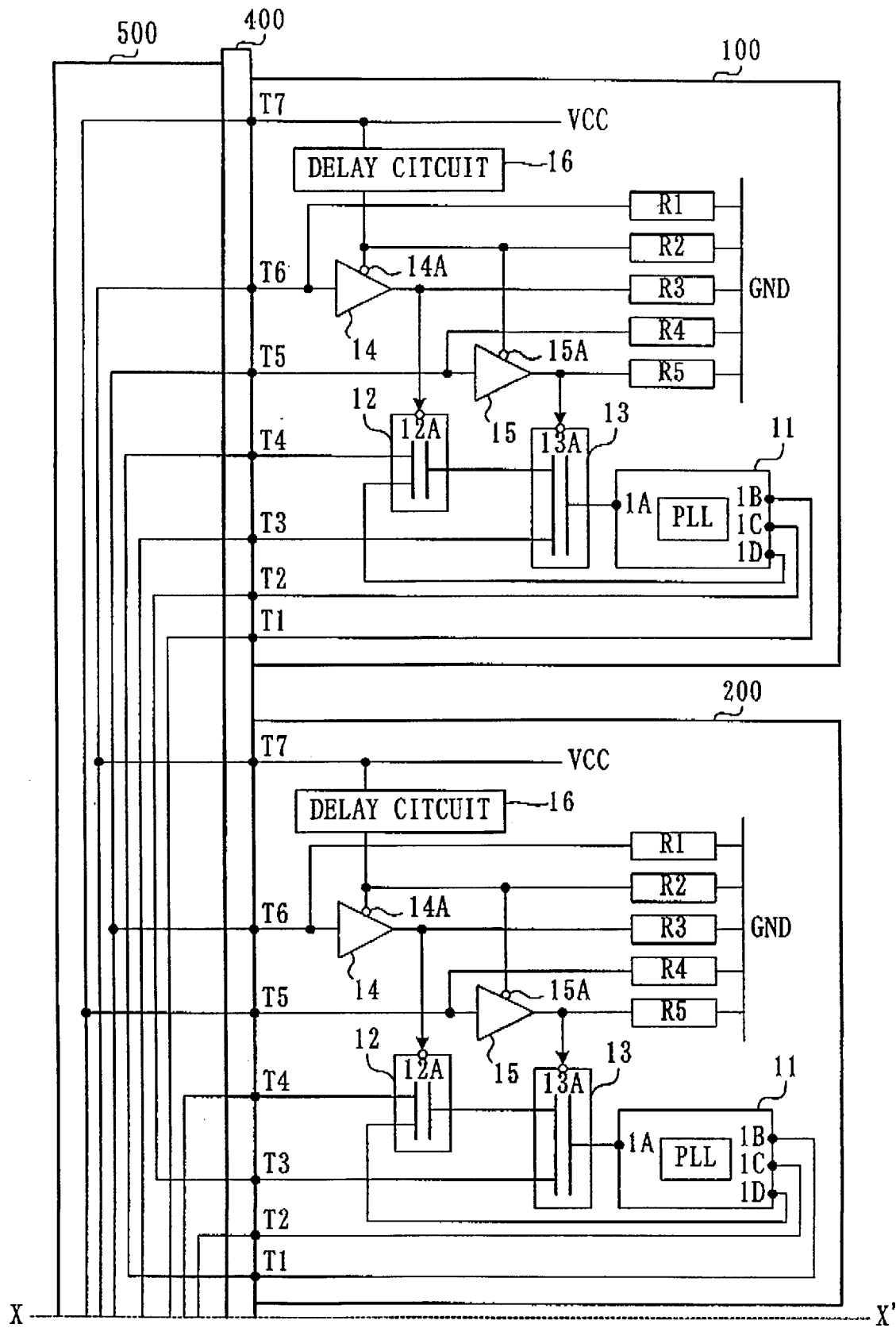
FIGS. 7A and 7B are a diagram showing a structure of a clock supplying unit according to a fourth embodiment.
Figure 7B:
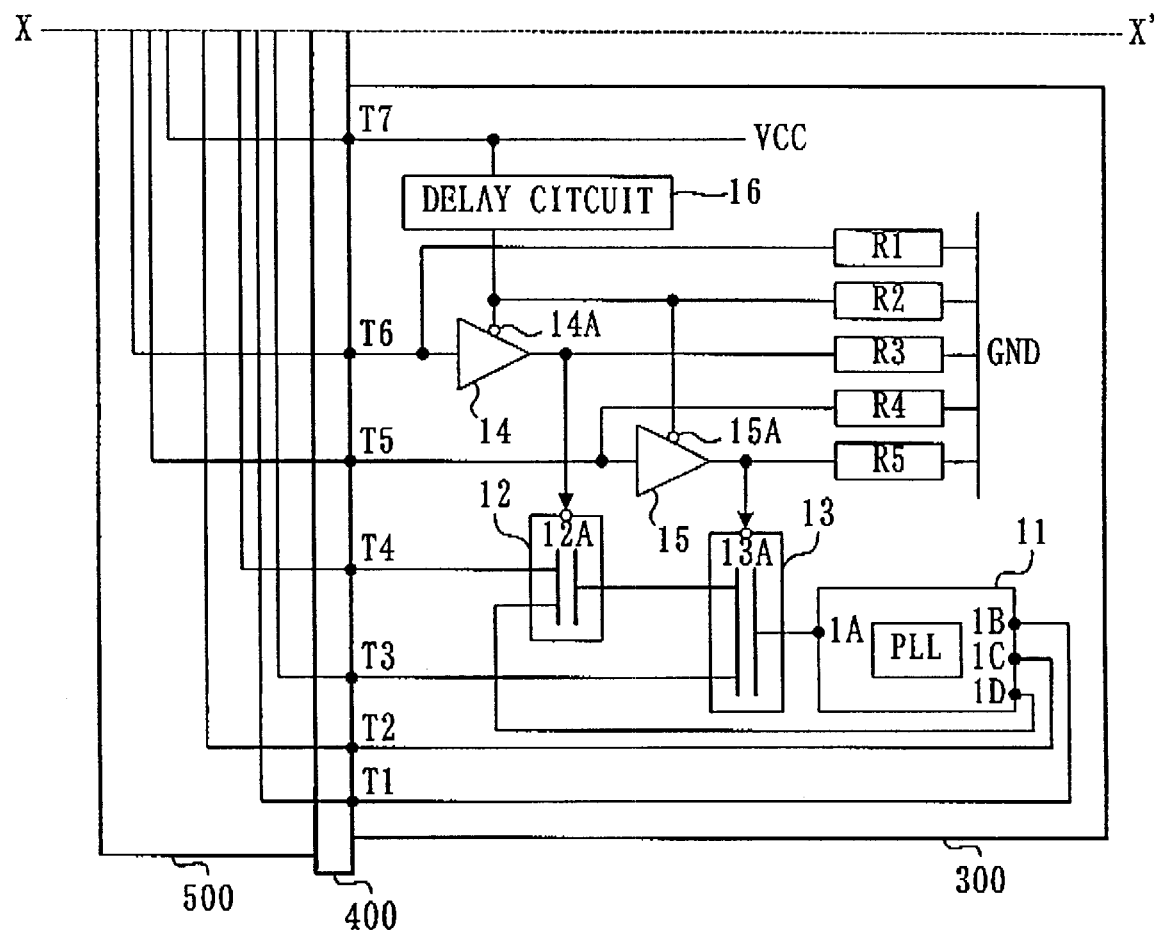

FIGS. 7A and 7B are block diagrams showing the structures of the clock supplying unit according to the fourth embodiment. The structures shown in FIG. 7A and FIG. 7B respectively are connected to each other at the line X-X'.

As shown in FIGS. 7A and 7B, the clock supplying unit comprises wiring boards 100, 200, and 300, a connector 400, and a back board 500. The wiring boards 100, 200, and 300 will be connected to the back board 500 via the connector 400 which is mounted on the back board 500.

As shown in FIGS. 7A and 7B, each of the wiring boards 100, 200, and 300 comprises a clock driver 11, selectors 12 and 13, buffer circuits 14 and 15, a delay circuit 16, and resistor circuits R1 to R5. Further, each of the wiring boards 100, 200, and 300 comprises connection terminals T1 to T7.

The connection terminals T1 to T7 are connected to one another through wirings formed on the back board 500, as shown in FIGS. 7A and 7B.

The clock driver 11 comprises one input terminal 1A and three output terminals 1B, 1C, and 1D. The clock driver 11 generates a clock signal which is synchronous with a clock signal supplied thereto through the input terminal 1A. Specifically, the clock driver 11 comprises a PLL circuit and makes the frequency and phase of a clock signal to be generated by the clock driver 11 follow the frequency and phase of a clock signal supplied thereto.

The generated clock signal is supplied to the connection terminal T1, the connection terminal T2, and the selector 12 through the output terminals 1B, 1C, and 1D, respectively. Further, the generated signal is supplied to other circuits (not illustrated) built in the electronic apparatus through the output terminals 1B, 1C, and 1D.

The selector 12 comprises a control terminal 12A, and supplies one of a clock signal supplied through the connection terminal T4 and a clock signal supplied from the clock driver 11 to the selector 13 in accordance with the electric potential of the control terminal 12A. For example, in a case where the electric potential of the control terminal 12A is at a low level, the selector 12 supplies a clock signal from the clock driver 11 to the selector 13. In a case where the electric potential of the control terminal 12A is at a high level, the selector 12 supplies a clock signal from the connection terminal T4 to the selector 13.

The selector 13 comprises a control terminal 13A, and supplies one of a clock signal from the connection terminal T3 and a clock signal from the selector 12 to the clock driver 11 in accordance with the electric potential of the control terminal 13A. For example, in a case where the electric potential of the control terminal 13A is at a low level, the selector 13 supplies a clock signal from the selector 12 to the clock driver 11. In a case where the electric potential of the control terminal 13A is at a high level, the selector 13 supplies a clock signal from the connection terminal T3 to the clock driver 11.

The buffer circuit 14 comprises an OE terminal 14A, and changes its state in accordance with the electric potential of the OE terminal 14A. Specifically, in a case where the electric potential of the OE terminal 14A is at a high level, the buffer circuit 14 becomes a disable state. In a case where the electric potential of the OE terminal 14A is at a low level, the buffer circuit 14 becomes an enable state.

In the enable state, the buffer circuit 14 outputs a control signal having a level corresponding to the electric potential of the connection terminal T6 to the control terminal 12A of the selector 12. For example, in a case where the electric potential of the connection terminal T6 is at a high level, the buffer circuit 14 outputs a high level control signal. In a case where the electric potential of the connection terminal T6 is at a low level, the buffer circuit 14 outputs a low level control signal.

The OE terminal 14A of the buffer circuit 14 is connected to the power source VCC via the delay circuit 16, and grounded via the resistor R2. An input terminal of the buffer circuit 14 is connected to the connection terminal T6, and grounded via the resistor R1. And an output terminal of the buffer circuit 14 is connected to the control terminal 12A of the selector 12, and grounded via the resistor R3. The buffer circuit 15 comprises an OE terminal 15A, and changes its state in accordance with the electric potential of the OE terminal 15A. Specifically, in a case where the electric potential of the OH terminal 15A is at a high level, the buffer circuit 15 becomes a disable state. In a case where the electric potential of the OE terminal 15A is at a low level, the buffer circuit 15 becomes an enable state.

In the enable state, the buffer circuit 15 outputs a control signal having a level corresponding to the electric potential of the connection terminal T5 to the control terminal 13A of the selector 13. For example, in a case where the electric potential of the connection terminal T5, is at a high level, the buffer circuit 15 outputs a high level control signal. In a case where the electric potential of the connection terminal T5 is at a low level, the buffer circuit 15 outputs a low level control signal.

The OE terminal 15A of the buffer circuit 15 is connected to the power source VCC via the delay circuit 16, and grounded via the resistor R2. An input terminal of the buffer circuit 15 is connected to the connection terminal T5 and grounded via the resistor R4. And an output terminal of the buffer circuit 15 is connected to the control terminal 13A of the selector 13, and grounded via the resistor R5.

The delay circuit 16 controls the states of the buffer circuits 14 and 15 by controlling supply of signals to the buffer circuits 14 and 15 from the power source VCC. Specifically, the delay circuit 16 does not supply a high level signal supplied from the power source VCC to the OE terminals 14A and 15A during a preset delay time DT3 after the wiring boards are connected to the back board 500. Due to this, during the delay time DT3 after the wiring boards are connected to the back board 500, the buffer circuits 14 and 15 are in the enable state. Then, after the delay time DT3 passes, the delay circuit 16 supplies a high level signal supplied from the power source VCC to the OE terminals 14A and 15A. Thus, after the delay time DT3 passes, the buffer circuits 14 and 15 becomes the disable state.

Next, the operation of the clock supplying unit according to the fourth embodiment will be explained.

In the following explanation, in order to distinguish the wiring boards 100, 200, and 300 from one another, a numeral [1] indicating the wiring board 100, a numeral [2] indicating the wiring board 200, and a numeral [3] indicating the wiring board 300 will be attached to the reference numerals.

It is assumed that the times it takes for a clock signal to reach the input terminal of the clock driver 11 from the output terminals of the same clock driver 11 or other clock drivers 11 are all the same.

(1) First, explanation will be given to a case where only the wiring board 100 will be connected to the back board 500 when any of the wiring boards 100, 200, and 300 is not yet connected to the back board 500.

Figure 8A:
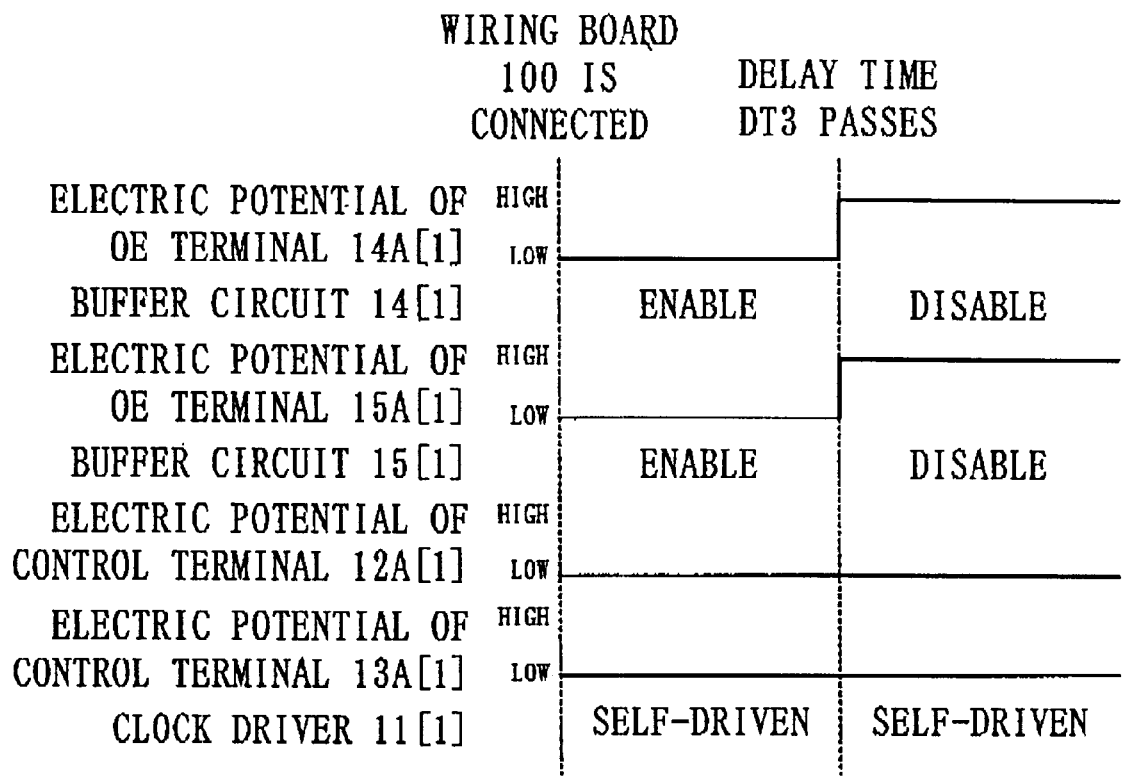
FIG. 8A is a timing chart showing actions of a wiring board 100 constituting the clock supplying unit shown in FIGS. 7A and 7B.

FIG. 8A is a timing chart showing actions on the wiring board 100. During the delay time DT3 after the wiring board lot is connected to the back board 500, the delay circuit 16[1] does not supply a signal supplied from the power source VCC to the OE terminals 14A[1] and 5A[1]. The OE terminals 14A[1] and 15A[1] are grounded via the resistor R2.

Therefore, as shown in FIG. 8A, during the delay time DT3, the electric potentials of the OE terminals 14A[1] and 15A[1] become a low level, and the buffer circuits 14[1] and 15[1] become the enable state.

Since only the wiring board 100 is connected to the back board 500, the electric potentials of the connection terminals T5[1] and T6[1] are at a low level. Accordingly, the buffer circuit 14[1] outputs a low level control signal to the control terminal 12A[1], and the buffer circuit 15[1] outputs a low level control signal to the control terminal 13A[1]. Thus, the electric potentials of the control terminals 12A[1] and 13A[1] become a low level, as shown in FIG. 8A.

In accordance with the control signal from the buffer circuit 14[1], the selector 12[1] supplies a clock signal supplied thereto from the clock driver 11[1] to the selector 13[1]. And in accordance with the control signal from the buffer circuit 15[1], the selector 13[1] supplies the clock signal supplied thereto from the selector 12[1] to the clock driver 11[1].

Due to this, the clock driver 11[1] generates a clock signal while being self-driven.

When the delay time DTT3 passes, the delay circuit 16[1] supplies a signal supplied from the power source VCC[1] to the OH terminals 14A[1] and 15A[1]. In response to this, the electric potentials of the OH terminals 14A[1] and 15A[1] become a high level, and the buffer circuits 14[1] and 15[1] become the disable state, as shown in FIG. 5A.

The output terminal of the buffer circuit 14[1] is grounded via the resistor R3, and the output terminal of the buffer circuit 15[1] is grounded via the resistor R5. Therefore, the electric potentials of the control terminals 12A[1] and 13A[1] stay at a low level, as shown in FIG. 8A.

As a result, the clock driver 11[1] continues to generate a clock signal while being self-driven, even after the delay time DT3 passes.

As described above, in a case where only the wiring board 100 is connected to the back board 506, the clock driver 11[1] generates a clock signal while being self-driven.

Also in a case where only the wiring board 200 or the wiring board 300 is connected to the back board 500, same actions are performed on the wiring board 200 or the wiring board 300.

(2) Next, explanation will be given to a case where only the wiring board 101 is connected to the back board 500 first, and then the wiring board 200 is connected to the back board 500 after the delay time DT3 for the wiring board 100 passes.

FIG. 8B is a dining chart showing actions on the wiring board 100 and the wiring board 200.

After the delay time DT3 for the wiring board 100 passes, the clock driver 11[1] generates a clock signal while being self-driven, as described above.

When the wiring board 200 is connected to the back board 500, a high level signal is supplied to the input terminal of the buffer circuit 14[1] from the power source VCC[2].

Since the wiring board 300 is not connected to the back board 500, the electric potential of the connection terminal T5[1] which is connected to the input terminal of the buffer circuit 15[1] stays at a low level.

However, the buffer circuits 14[1] and 15[1] are in the disable state after the delay time DT3 for the wiring board 100 passes. Therefore, the electric potentials of the control terminals 12A[1] and 13A[1] do not change from a low level. Accordingly, even after the wiring board 200 is connected to the back board 500, the clock driver 11[1] keeps generating a clock signal while being self-driven.

On the other hand, the delay circuit 16[2] does not supply a signal supplied from the power source VCC[2] to the OE terminals 14A[2] and 15A[2] during the delay time DT3 after the wiring board 200 is connected to the back board 500. And the OE terminals 14A[2] and 15A[2] are grounded via the resistor R2.

Therefore, as shown in FIG. 8B, during the delay time DT3, the electric potentials of the OE terminals 14A[2] and 15A[2] become a low level, and the buffer circuits 14[2] and 15[2] become the enable state.

However, since the wiring board 300 is not connected to the back board 500, the electric potential of the connection terminal T6[2] which is connected to the input terminal of the buffer circuit 14[2] is at a low level. Thus, the buffer circuit 14[2] outputs a low level control signal to the control terminal 12A[2]. Due to this, the electric potential of the control terminal 12A[2] becomes a low level, as shown in FIG. 8B.

On the other hand, a high level signal is supplied to the input terminal of the buffer circuit 15[2] from the power source VCC[1]. Thus, the buffer circuit 15[2] outputs a high level control signal to the control terminal 13A[2]. Due to this, the electric potential of the control terminal 13A[2] becomes a high level, as shown in FIG. 8B.

In response to the control signal from the buffer circuit 14[2], the selector 12[2] selects a clock signal supplied through the connection terminal T4[2]. However, since the wiring board 300 is not connected to the back board 500, the selector 12[2] does not supply a signal to the selector 13[2].

On the other hand, in response to the control signal from the buffer circuit 15[2], the selector 13[2] supplies a clock signal supplied through the control terminal T3[2], i.e., a clock signal generated by the clock driver 11[1], to the clock driver 11[2].

Thus, the clock driver 11[2] generates a clock signal in accordance with the clock signal from the clock driver 11[1]. In other words, the clock driver 11[2] generates a clock signal having a frequency and phase same as the frequency and phase of the clock signal generated by the clock driver 11[1].

When the delay time DT3 for the wiring board 200 passes, the delay circuit 16[2] supplies a signal supplied from the power source VCC[2] to the OE terminals 14A[2] and 15A[2]. In response to this, the electric potentials of the OE terminals 14A[2] and 15A[2] become a high level, and the buffer circuits 14[2] and 15[2] become the disable state, as shown in FIG. 5B. The output terminal of the buffer circuit 14[2] is grounded via the resistor A, and the output terminal of the buffer circuit 15[2] is grounded via the resistor RS. Therefore, the electric potentials of the control terminals 12A[2] and 13A[2] become a low level, as shown in FIG. 8B.

Thus, the selector 12[2] supplies a clock signal supplied from the clock driver 11[2] to the selector 13[2], and the selector 13[2] supplies the clock signal supplied from the selector 12[2] to the clock driver 11[2].

As a result, the clock driver 11[2] generates a clock signal while being self-driven, after the delay time DT3 passes.

As described above, during the delay time DT3 after the wiring board 200 is connected to the back board 500, the clock driver 11[2] generates a clock signal in accordance with a clock signal from the clock driver 1[1]. Due to this, the frequency and phase of the clock signal generated by the clock driver 11[1] and the frequency and phase of the clock signal generated by the clock driver 11[2] can be coincident with each other.

Further, likewise the first to third embodiments, it is possible to adjust the timings of clock signals without stopping the operation of the electronic apparatus (system) for even an instant.

(3) Next, explanation will be given to a case where when only the wiring board 100 is connected to the back board 500, the wiring board 300 will then be connected to the back board 500 after the delay time DT for the wiring board 100 passes.

FIG. 5C is a timing chart showing actions on the wiring board 100 and wiring board 300.

As described above, after the delay time DT3 for the wiring board 100 passes, the buffer circuits 14[1] and 15[1] are in the disable state. Thus, even after the wiring board 300 is connected to the back board 500, the clock driver 11[1] keeps generating a clock signal while being self-driven.

On the other hand, during the delay time DT3 after the wiring board 300 is connected to the back board 500, the delay circuit 16[3] does not supply a signal supplied from the power source VCC[3] to the OE terminals 14A[3] and 15A[3]. And the OE terminals 14A[3] and 15A[3] are grounded via the resistor R2.

Thus, as shown in FIG. 5C, the electric potentials of the OE terminals 14A[3] and 15A[3] become a low level, and the buffer circuits 14[3] and 15[3] become the enable state during the delay time DT3.

A high level signal is supplied from the power source VCC[1] to the input terminal of the buffer circuit 14[3]. In response to this, the buffer circuit 14[3] outputs a high level control signal to the control terminal 12A[3]. Thus, the electric potential of the control terminal 12A[3] becomes a high level, as shown in FIG. 8C.

Since the wiring board 200 is not connected to the back board 500, the electric potential of the connection terminal T5[3] which is connected to the input terminal of the buffer circuit 15[3] is at a low level. Thus, the buffer circuit 15[3] outputs a low level control signal to the control terminal 13A[3]. Due to this, the electric potential of the control terminal 13A[3] becomes a low level, as shown in FIG. 5C.

In response to the control signal from the buffer circuit 14[3], the selector 12[3] supplies a clock signal supplied through the connection terminal T4[3], i.e., a clock signal generated by the clock driver 11[1] to the selector 13[3].

In response to the control signal from the buffer circuit 15[3], the selector 13[3] supplies the clock signal supplied from the selector 12[3] to the clock driver 11[3].

Accordingly, the clock driver 11[3] generates a clock signal in accordance with the clock signal generated by the clock driver 11[1]. In other words, the clock driver 11[3] generates a clock signal having the same frequency and phase as the frequency and phase of the clock signal generated by the clock driver 11[1].

When the delay time DT3 for the wiring board 300 passes, the delay circuit 16[3] supplies a signal supplied from the power source VCC[3] to the OE terminals 14A[3] and 15A[3]. Thus, the electric potentials of the OE terminals 14A[3] and 15A[3] become a high level, and the buffer circuits 14[3] and 15[3] become the disable state, as shown in FIG. 8C.

The output terminal of the buffer circuit 14[3] is grounded via the resistor R3, and the output terminal of the buffer circuit 15[3] is grounded via the resistor R5. Therefore, the electric potentials of the control terminals 12A[3] and 13A[3] become a low level, as shown in FIG. 8C.

Accordingly, the selector 12[3] supplies a clock signal supplied from the clock driver 11[3] to the selector 13[3], and the selector 13[3] supplies the clock signal supplied from the selector 12[3] to the clock driver 11[3].

As a result, the clock driver 11[3] generates a clock signal while being self-driven after the delay time DT3 passes.

As described above, during the delay time DT3 after the wiring board 300 is connected to the back board 500, the clock driver 11[3] generates a clock signal in accordance with a clock signal from the clock driver 11[1]. Therefore, it is possible to make the frequency and phase of the clock signal generated by the clock driver 11[1] coincide with the frequency and phase of the clock signal generated by the clock driver 11[3].

Further, it is possible to adjust the timings of clock signals without stopping the operation of the electronic apparatus (system) for even an instant, likewise the first to third embodiments.

The same actions as described above will be performed also in a case where only the wiring board 200 or the wiring board 300 is connected to the back board 500 first, and then another wiring board will be connected to the back board 500 after the delay time DT3 for the wiring board 200 or the wiring board 300 passes.

(4) Next, explanation will be given to a case where the wiring board 100 and wiring board 200 are connected to the back board 500 first, and then the wiring board 300 will be connected to the back board 500 after the delay time DT3 for the wiring board 100 and wiring board 200 passes.

FIG. 8D is a timing chart showing actions on the wiring boards 100, 200, and 300.

After the delay time DT3 for the wiring boards 100 and 200 passes, the clock drivers 11[1] and 11[2] keep generating a clock signal while being self-driven, even after the wiring board 300 is connected to the back board 500, as explained above.

The delay circuit 16[3] does not supply a signal supplied from the power source VCC[3] to the OE terminals 14A[3] and 15A[3] during the delay time DT3 after the wiring board 300 is connected to the back board 500. The OE terminals 14A[3] and 15A[3] are grounded via the resistor R2.

Therefore, during the delay time DT3, the electric potentials of the OE terminals 14A[3] and 15A[3] are at a low level, and the buffer circuits 14[3] and 15[3] are in the enable state, as shown in FIG. 8D.

A high level signal is supplied from the power source VCC[1] to the input terminal of the buffer circuit 14[3], and a high level signal is supplied from the power source VCC[2] to the input terminal of the buffer circuit 15[3].

Thus, the buffer circuit 14[3] outputs a high level control signal to the control terminal 12A[3], and the buffer circuit 15[3] outputs a high level control signal to the control terminal 13A[3]. In response to this, the electric potentials of the control terminals 12A[3] and 13A[3] become a high level, as shown in FIG. 8D.

In response to the control signal from the buffer circuit 14[3], the selector 12[3] supplies a clock signal supplied through the connection terminal T4[3], i.e., a clock signal generated by the clock driver 11[1], to the selector 13[3].

In response to the control signal from the buffer circuit 15[3], the selector 13[3] supplies a clock signal supplied from the connection terminal T3[3], i.e., a clock signal generated by the clock driver 11[2], to the clock driver 11[3].

Due to this, the clock driver 11[3] generates a clock signal in accordance with a clock signal generated by the clock driver 11[2]. In other words, the clock driver 11[3] generates a clock signal having a frequency and phase same as the frequency and phase of the clock signal generated by the clock driver 11[2]. When the delay time DT3 for the wiring board 300 passes, the electric potentials of the OE terminals 14A[3] and 15A[3] become a high level, and the buffer circuits 14[3] and 15[3] become the disable state, likewise the case explained above. Thus, the clock driver 11[3] generates a clock signal while being self-driven.

As described above, during the delay time DT3 after the wiring board 300 is connected to the back board 500, the clock driver 11[3] generates a clock signal in accordance with a clock signal from the clock driver 11[2]. Therefore, it is possible to make the frequencies and phases of the clock signals respectively generated by the clock drivers 11[1], 11[2], and 11[3] coincide with one another.

Further, likewise the first to third embodiments, it is possible to adjust the timings of clock signals without stopping the operation of the electronic apparatus (system) for even an instant.

The same actions as described above will be performed also in a case where the wiring boards 100 and 300 are connected to the back board 500 first and then the wiring board 200 is connected to the back board 500, and in a case where the wiring boards 200 and 300 are connected to the back board 500 first and then the wiring board 100 is connected to the back board 500.

The wiring boards 100, 200 and 300 may comprise the switch 5 shown in the second embodiment, and the monostable circuit 6, the pulse generation circuit 7, and the delay circuit 8 shown in the third embodiment.

Figure 9A:
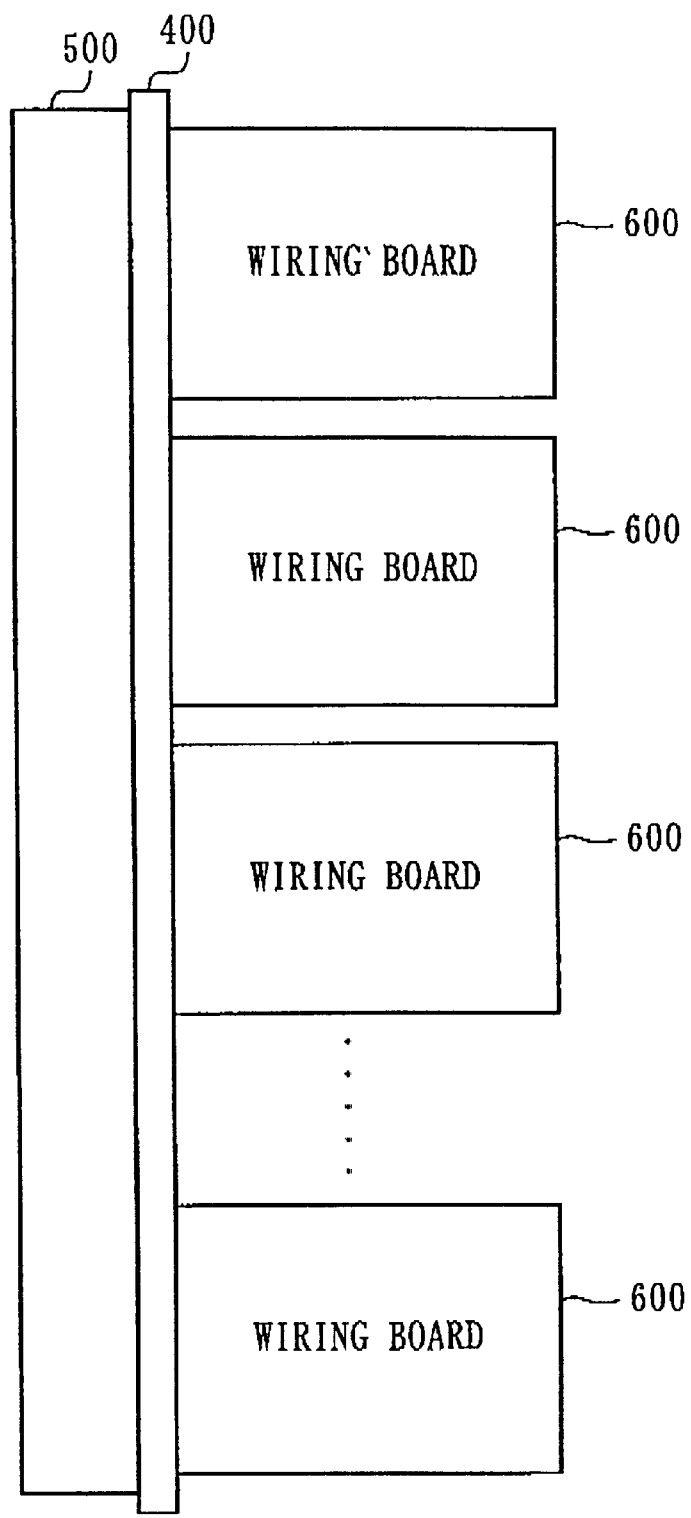
FIGS. 9A and 9B are diagrams showing structures of a clock supplying unit in a case where four or more wiring boards are to be connected.

Further, as shown in FIG. 9A, four or more wiring boards 600 may be connected to the back board 500.

Figure 9B:
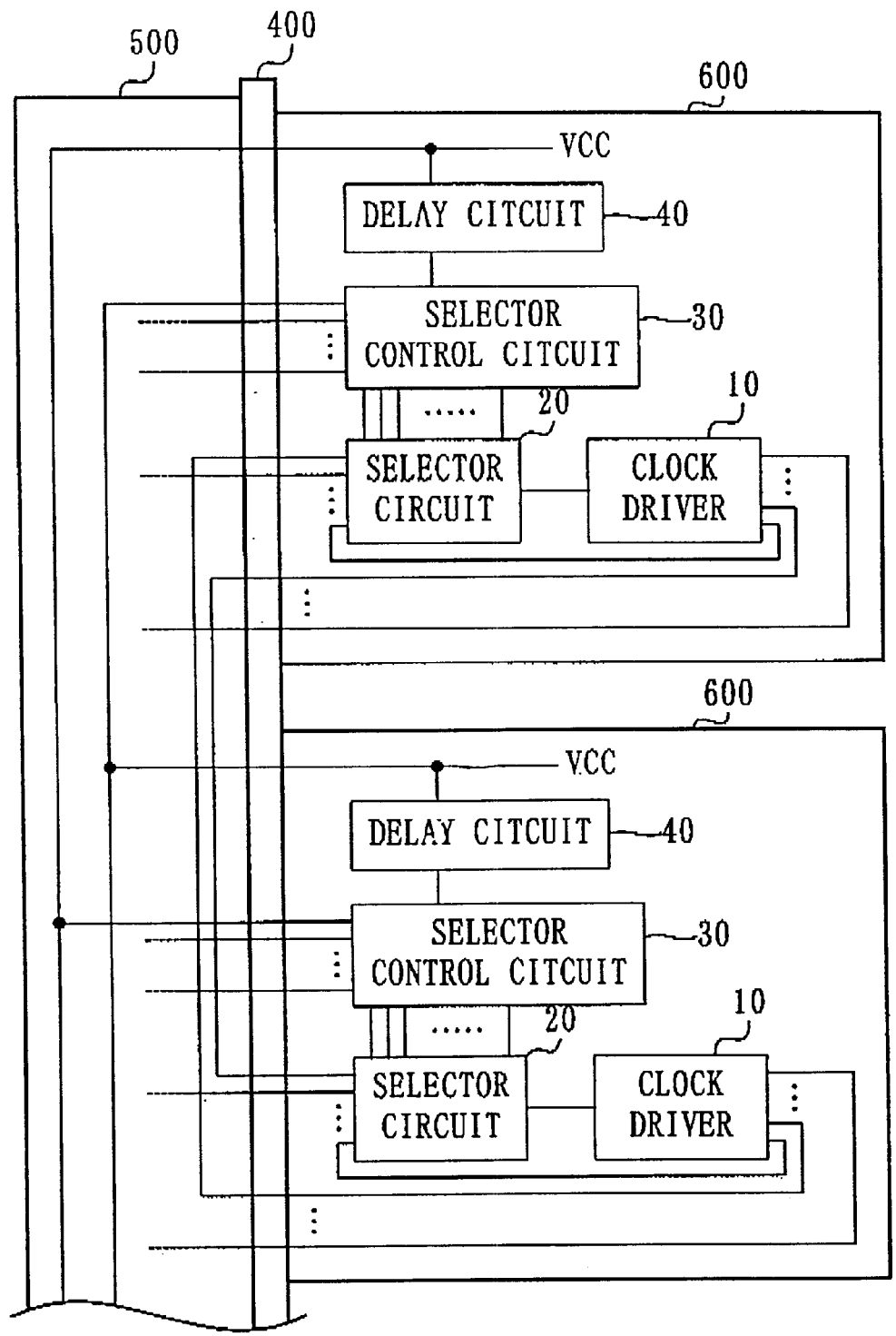

In this case, each wiring board 600 may comprise a clock driver 10, a selector circuit 20, a selector control circuit 30, and a delay circuit 40, as shown in FIG. 9B.

The clock driver 10 comprises a PLL circuit, and generates a clock signal in accordance with a clock signal supplied from the selector circuit 20. Then, the clock driver 10 supplies the generated clock signal to the selector circuit 20 of the wiring board 600 to which it belongs, and also supplies the generated clock signal to the selector circuits 20 of the other wiring boards 600 that are connected to the back board 500 through wirings formed on the back board 500.

The selector circuit 20 is supplied with clock signals from the clock driver 10 of all the wiring boards 600 that are connected to he back board 500. Then, the selector circuit 20 supplies one of the supplied clock signals to the clock driver 10 in accordance with a control signal supplied from the selector control circuit 30.

The selector control circuit 30 is supplied with a high level signal from a power source $VCC_{(self)}$ of the wiring board 600 to which it belongs, and is supplied with high level signals from power sources $VCC_{(others)}$ of the other wiring boards 600 that are connected to the back board 500.

The selector control circuit 30 supplies the selector circuit 20 with a control signal for controlling the selector circuit 20 to select a clock signal generated by the clock driver 10 of the wiring board 600 to which it belongs, in a case where the selector control circuit 30 is supplied with no signal from either of the power source $VCC_{(self)}$ and power sources $VCC_{(others)}$ in a case where the selector control circuit 30 is supplied with signals from both of the power source $VCC_{(self)}$ and power sources $VCC_{(other)}$, and in a case where the selector control circuit 30 is supplied with a signal from only the power source $VCC_{(self)}$.

In a case where supplied with signals from only the power sources $VCC_{(other)}$ a the selector control circuit 30 supplies the selector circuit 20 with a control signal for controlling the selector circuit 20 to select one of clock signals generated by the clock drivers 10 of the other wiring boards 600 that are connected to the back board 500.

The delay circuit 40 does not supply a signal supplied from the power source VCC to the selector control circuit 30 during a predetermined delay time DT4 after the wiring board 600 to which it belongs is connected to the back board son. After the delay time DT4 passes, the delay circuit 40 supplies a signal supplied from the power source VCC to the selector control circuit 30.

With this structure, in a case where only one wiring board 600 is connected to the back board 500, the clock driver 10 generates a clock signal while being self-driven, likewise the above described embodiments.

In a case where one or More wiring boards 600 are connected to the back board 500, the clock driver 10 of another wiring board 600 to be newly connected will generate a clock signal in accordance with a clock signal from the clock driver 10 of an already-connected wiring board 600 during the delay time DT4, likewise the above described embodiments. Then, when the delay time DT4 passes, the clock driver 10 of be newly-connected wiring board 600 will generate a clock signal while being self-driven.

Due to this structure, it is possible to make the clock signals generated by the clock drivers 10 of the plurality of wiring boards 600 connected to the back board 500 coincide with one another, likewise the above described embodiments.

The connection terminals T1 to T7 may not be connected to one another through wirings formed on the back board 500, but may be connected to one another through cables, etc.

Various embodiments and changes may be made thereunto without departing from the broad spirit and scope of the invention. The above-described embodiments are intended to illustrate the present invention, not to limit the scope of the present invention.

The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2001-248528 filed on Aug. 20, 2001 and including specification, claims, drawings and summary. The disclosure of the above Japanese Patent Application is incorporated herein by reference in its entirety.

What is claimed is:

1. A clock signal generation device to and from which a plurality of clock generation units for generating clock signals are attached and detached, and which comprises at least one clock generation unit,
    wherein:
        each of said plurality of clock generation units comprises
            a clock driver which generates a clock signal in accordance with a reference clock, and
            a supplying unit which supplies the reference clock to said clock driver;
        said supplying unit supplies said clock driver, in a case where another clock generation unit is already attached to said clock signal generation device at a time said clock generation unit to which said supplying unit belongs is attached to said clock signal generation device, with a clock signal generated by said clock driver of said another clock generation unit as the reference clock during a predetermined first time; and
        said clock driver makes a clock signal to be generated follow the supplied reference clock.

2. The clock signal generation device according to claim 1,
    wherein said supplying unit supplies said clock driver of said clock generation unit, to which said supplying unit belongs, with a clock signal generated by said clock driver of said clock generation unit to which said supplying unit belongs as the reference clock, after the first time passes.

3. The clock signal generation device according to claim 2,
    wherein said supplying unit comprises:
        a control unit which outputs a control signal for selecting the reference clock from clock signals generated by said clock drivers of said clock generation units which are attached to said clock signal generation device; and
        a selector circuit which selects one of clock signals generated by said clock drivers of said clock generation units which are attached to said clock signal generation device in accordance with the control signal, and supplies the selected clock signal to said clock driver as the reference clock.

4. The clock signal generation device according to claim 3,
    wherein said control unit comprises:
        a delay circuit which delay the first time; and
        a control circuit which outputs the control signal to said selector circuit in accordance with a delaying result of said delay circuit.

5. The clock signal generation device according to claim 4,
    wherein:
        said delay circuit supplies a first level signal to said control circuit during the first time, and supplies a second level signal to said control circuit after the first time passes; and
        said control circuit outputs to said selector circuit, the control signal for controlling said selector circuit to select the clock signal generated by said clock driver of another clock generation unit, in a case where said control circuit is supplied with the first level signal and said another clock generation unit is attached to said clock signal generation device.

6. The clock signal generation device according to claim 5,
    wherein said control circuit outputs to said selector circuit, the control signal for controlling said selector circuit to select the clock signal generated by said clock driver of said clock generation unit to which said control circuit belongs, in a case where said control circuit is supplied with the first level signal and no other clock generation unit is attached to said clock signal generation device.

7. The clock signal generation device according to claim 5,
    wherein said control circuit outputs to said selector circuit, the control signal for controlling said selector circuit to select the clock signal generated by said clock driver of said clock generation unit to which said control circuit belongs, in a case where said control circuit is supplied with the second level signal.

8. The clock signal generation device according to claim 7,
    wherein said control unit further comprises an adjusting unit which shuts off the second level signal supplied by said delay circuit, and instead supplies the first level signal to said control circuit during a predetermined second time.

9. The clock signal generation device according to claim 8,
    wherein said adjusting unit supplies the first level signal to said control circuit during the second time, each time a predetermined third time passes.

10. The clock signal generation device according to claim 9,
    wherein said clock driver comprises a PLL (Phase Locked Loop) circuit which makes the clock signal follow the reference clock.

* * * * *